United States Patent
Bute et al.

(10) Patent No.: US 9,667,749 B2
(45) Date of Patent: *May 30, 2017

(54) CLIENT-INITIATED LEADER ELECTION IN DISTRIBUTED CLIENT-SERVER SYSTEMS

(71) Applicant: International Business Machines Corporation, Armonk, NY (US)

(72) Inventors: Yogesh A. Bute, Pune (IN); Hemant K. Shukla, Jabalpur (IN); Vinod K. Srivastava, Pune (IN); Sandip P. Thube, Pune (IN); Dharmesh V. Vadgama, Pune (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/299,619

(22) Filed: Oct. 21, 2016

(65) Prior Publication Data

US 2017/0070598 A1 Mar. 9, 2017

Related U.S. Application Data

(63) Continuation of application No. 15/132,394, filed on Apr. 19, 2016, now Pat. No. 9,525,725, which is a (Continued)

(51) Int. Cl.
*G06F 15/16* (2006.01)
*H04L 29/06* (2006.01)
(Continued)

(52) U.S. Cl.
CPC ............. *H04L 67/42* (2013.01); *H04L 43/10* (2013.01); *H04L 67/10* (2013.01); *H04L 67/2842* (2013.01)

(58) Field of Classification Search
CPC ....... H04L 67/42; H04L 67/2842; H04L 43/10; H04L 67/10; H04L 65/403; H04L 65/1069; H04L 67/1002; H04L 67/145
See application file for complete search history.

(56) References Cited

U.S. PATENT DOCUMENTS 7,421,578 B1 9/2008 Huang et al.
8,560,626 B2 10/2013 Nelson
(Continued)

OTHER PUBLICATIONS

Tyagi et al., "Co-Leader Based Leader Election Algorithm in Distributed Environment", Department of Computer Science and Engineering, Jaypee University of Information Technology, Elsevier, ICC-2014, pp. 261-266.

(Continued)

*Primary Examiner* — John MacIlwinen
(74) *Attorney, Agent, or Firm* — L. Jeffrey Kelly

(57) ABSTRACT

A method for a client-initiated leader election in a distributed system including receiving a master listener election request by at least one listener of a plurality of listeners in the distributed system, arranging a list of configured listeners in a descending priority order, the list of configured listeners comprises one or more listeners of the plurality of listeners set for connection, selecting a listener with a highest priority from the list of configured listeners, determining an availability of the selected listener, verifying a connectivity to the selected listener using a ping utility program, assigning the selected listener as a master listener based on the connectivity, and connecting to the master listener.

1 Claim, 8 Drawing Sheets

Related U.S. Application Data continuation of application No. 14/847,051, filed on Sep. 8, 2015.

(51) Int. Cl.
  *H04L 29/08* (2006.01)
  *H04L 12/26* (2006.01)

(56) References Cited

U.S. PATENT DOCUMENTS

| | | |
|---|---|---|
| 8,583,958 B2 | 11/2013 | Surkov |
| 9,167,011 B2 | 10/2015 | Ellison et al. |
| 2002/0042693 A1 | 4/2002 | Kampe et al. |
| 2008/0281938 A1 | 11/2008 | Rai et al. |

OTHER PUBLICATIONS

Mell et al., "The NIST Definition of Cloud Computing", National Institute of Standards and Technology, Special Publication 800-145, Sep. 2011, pp. 1-7.
Burrows, "The Chubby lock service for loosely-coupled distributed systems", Google Inc., Nov. 6, 2006, 16 pages.
Hunt et al., "ZooKeeper: Wait-free coordination for Internet-scale systems", Yahoo! Research, Jun. 23, 2010, 14 pages.
Reza et al., "Improved Algorithms for Leader Election in Distibuted Systems", 2010 IEEE, pp. V2-6-V2-10.
"Appendix P: List of IBM Patents or Patent Applications Treated as Related", Dated Dec. 13, 2016, pp. 1-2.
U.S. Appl. No. 14/847,051, filed Sep. 8, 2015; Entitled "Client-Initiated Leader Election in Distributed Client-Server Systems".
U.S. Appl. No. 15/132,394, filed Apr. 19, 2016; Entitled "Client-Initiated Leader Election in Distributed Client-Server Systems".
U.S. Appl. No. 15/299,633, filed Oct. 21, 2016; Entitled "Client-Initiated Leader Election in Distributed Client-Server Systems".

CLIENT-INITIATED LEADER ELECTION IN DISTRIBUTED CLIENT-SERVER SYSTEMS

BACKGROUND

The present invention generally relates to the field of distributed computing, and more particularly to an algorithm for a client-initiated leader election in a distributed client-server system.

A distributed system may generally include numerous autonomous computational units, each of which may have its own local memory. Such autonomous computational units may communicate with each other by message passing. Each, computational unit may be typically referred to as "a computer node" or simply "a node". In the distributed system, there is usually a shared goal which may include, for example, solving a large computational problem. In some instances, each node of the distributed system may have its own user with specific needs. In such cases, the goal of the distributed system may be to coordinate the use of shared resources or provide communication services to the users. The structure of the distributed system (network topology, network latency, number of computers) may not be recognized in advance; however the distributed system may consist of different types of computers and network links, which may vary during the execution of a distributed program.

SUMMARY

According to an embodiment of the present disclosure, a method for a client-initiated leader election in a distributed system may include receiving a master listener election request by at least one listener of a plurality of listeners in the distributed system, arranging a list of configured listeners in a descending priority order, the list of configured listeners may include one or more listeners of the plurality of listeners set for connection, selecting a listener with a highest priority from the list of configured listeners, determining an availability of the selected listener, verifying a connectivity to the selected listener using a ping utility program, assigning the selected listener as a master listener based on the connectivity, and connecting to the master listener.

According to another embodiment of the present disclosure, a computer system for a client-initiated leader election in a distributed system may include one or more processors, one or more computer-readable memories, one or more computer-readable tangible storage devices, and program instructions stored on at least one of the one or more storage devices for execution by at least one of the one or more processors via at least one of the one or more memories, the computer system is capable of performing a method including: receiving a master listener election request by at least one listener of a plurality of listeners in the distributed system, arranging a list of configured listeners in a descending priority order, the list of configured listeners may include one or more listeners of the plurality of listeners set for connection, selecting a listener with a highest priority from the list of configured listeners, determining an availability of the selected listener, verifying a connectivity to the selected listener using a ping utility program, assigning the selected listener as a master listener based on the connectivity, and connecting to the master listener.

According to another embodiment of the present disclosure, a computer program product for a client-initiated leader election in a distributed system may include a computer readable non-transitory article of manufacture tangibly embodying computer readable instructions which, when executed, cause a computer to carry out a method including: receiving a master listener election request by at least one listener of a plurality of listeners in the distributed system, arranging a list of configured listeners in a descending priority order, the list of configured listeners may include one or more listeners of the plurality of listeners set for connection, selecting a listener with a highest priority from the list of configured listeners, determining an availability of the selected listener, verifying a connectivity to the selected listener using a ping utility program, assigning the selected listener as a master listener based on the connectivity, and connecting to the master listener.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
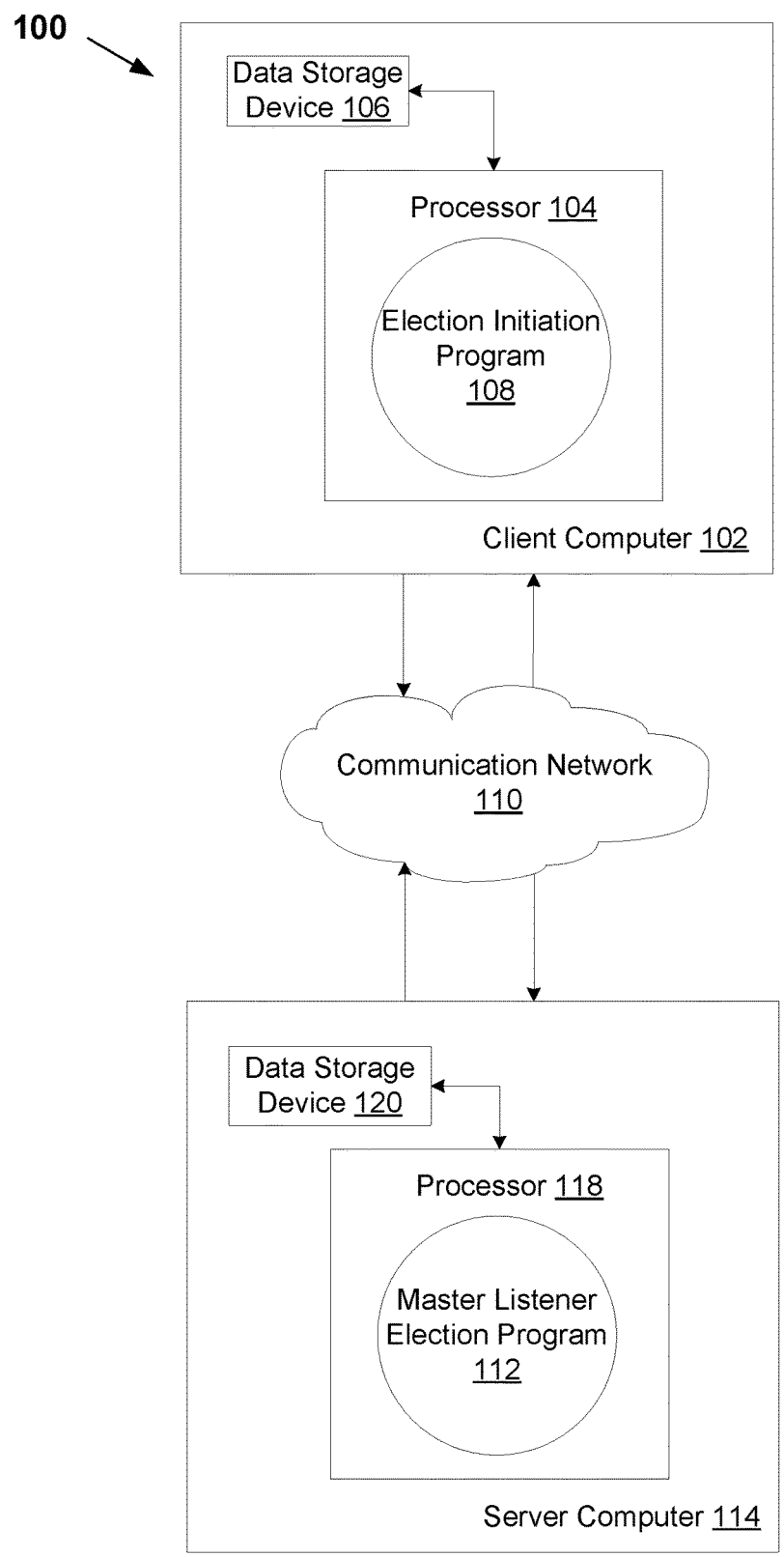
FIG. 1 depicts a block diagram illustrating a networked computer environment, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The present invention generally relates to the field of distributed computing, and more particularly to an algorithm for a client-initiated leader election in a distributed client-server system. The following described exemplary embodiments provide a system, method and computer program product for electing a leader among a plurality of listener nodes (servers) in a distributed system with a reduced amount of messages exchanged between the listener nodes and a minimal chance of collision.

In distributed systems, leader election is typically performed via consensus, which is the process of agreeing on one leader among a group of participants. The leader election problem may be difficult to solve because participants (or their communication media) may experience failures and/or collisions between nodes.

An example of distributed systems may include a clustered system, which is usually defined as a distributed system managed as a single unit within the same local network. As the number of nodes n in a given clustered system grows, network chatter increases by n^2 as consensus requires communication with each node within the system. So, if the number of nodes grows by 10, then chatter grows by 100.

Existing solutions may exhibit a high probability of "bad election collision", which may occur when two or more elections have started so close in time to each other that no quorum could be reached in order to finish the election. Moreover, previous solutions may not guarantee that a single leader is elected.

Embodiments of the present disclosure illustrate an algorithm for leader election in a distributed system. An exemplary distributed system may include, for example, a clustered system having a plurality of listener nodes (servers) running on multiple physical machines (within the same network) and waiting for a client computer to request a connection via this listener system.

The plurality of listener nodes may need to elect one listener among them as a "master listener". The master listener may manage the load balancing among all listeners of the plurality of listeners, listener fail-over, and other monitoring and health-check use-cases. The main purpose of the master listener may generally include: getting requests from the client computer, and send those requests to the appropriate allocated listener process using a load balancing algorithm. The load balancing algorithm may run on the master listener, and whenever there is a request from the client computer for a listener, based on the load balancing algorithm, the master listener may return the next available listener to the client computer.

In the proposed system, the plurality of listener nodes (servers) are running on multiple physical machines and waiting for a request from the client computer. The election of a leader may not take place until there is a request from the client computer. Once this listener cluster receives a request from the client computer, to serve this request from any of the listener nodes, the selected listener node may check if a master listener already exists in the system. If the master listener is present in the system, then the selected listener node may return the details of the elected master listener to the client computer for further processing. If the master listener is not already elected or not available then the selected listener node starts the election of a leader from the available listener nodes based on their priorities. It should be noted that the client computer may select the listener node based on priorities defined in the system configuration.

The priority of each listener node to become a master listener may be pre-configured and changed during the course of time. Each listener node (server) may read the configuration upon listener startup or when there is any change in priority.

A listener node which receives a request from the client computer may start the master listener election algorithm described above. Then, a configuration check may be performed in which if the listener node that receives the request is the highest priority listener available in the system, it becomes the master listener and updates other listener nodes via a heartbeat request. The other listener nodes will update their configuration with the master listener information and use it for further request serving. The election of the master listener may take place in a minimal number of messages exchanged between nodes (best case 1 message and worst case n messages).

In the proposed system, listener nodes may communicate with the master listener only and may not communicate with other listener nodes. This may help decrease the network chatter. Whenever a request goes to a listener node with lower priority, that listener node checks for the available listener node and their priorities. Once the listener node finds that there is a higher priority listener available, it may inform the client computer about that listener node in response to its request. Then, the client computer may connect to that listener node, and may assign the selected listener node as the master listener.

Therefore, by selecting a master listener from a plurality of listener nodes in a distributed system and using a load balancing algorithm, embodiments of the present disclosure may, among other potential benefits, guarantee the election of a single leader in simple topologies avoiding bad election collision while minimizing network chatter such that when a fault occurs, recovery may be substantially seamless.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring to FIG. 1, an exemplary networked computer environment 100 is depicted, according to an embodiment of the present disclosure. In this embodiment, the network computer environment 100 illustrates an exemplary client-server distributed system. The networked computer environment 100 may include a client computer 102 with a processor 104 and a data storage device 106 that is enabled to run an election initiation program 108. The networked computer environment 100 may also include a server computer 114 and a communication network 110. The networked computer environment 100 may include a plurality of client computers 102 and server computers 114, only one of which is shown. It should be noted that in distributed systems, the server computer 114 may also be referred to as a "listener node", or simply as a "listener". The communication network 110 may include various types of communication networks, such as a wide area network (WAN), local area network (LAN), a telecommunication network, a wireless network, a public switched network and/or a satellite network. It should be appreciated that FIG. 1 provides only an illustration of one implementation and does not imply any limitations with regard to the environments in which different embodiments may be implemented. Many modifications to the depicted environments may be made based on design and implementation requirements.

The client computer 102 may communicate with a master leader election program 112 running on server computer 114 via the communications network 110. The communication network 110 may include connections, such as wire, wireless communication links, or fiber optic cables. As will be discussed with reference to FIG. 4, server computer 114 may include internal components 402a and external components 404a, respectively, and client computer 102 may include internal components 402b and external components 404b, respectively. Client computer 102 may be, for example, a mobile device, a telephone, a personal digital assistant, a netbook, a laptop computer, a tablet computer, a desktop computer, or any type of computing devices capable of accessing a network.

Figure 2:
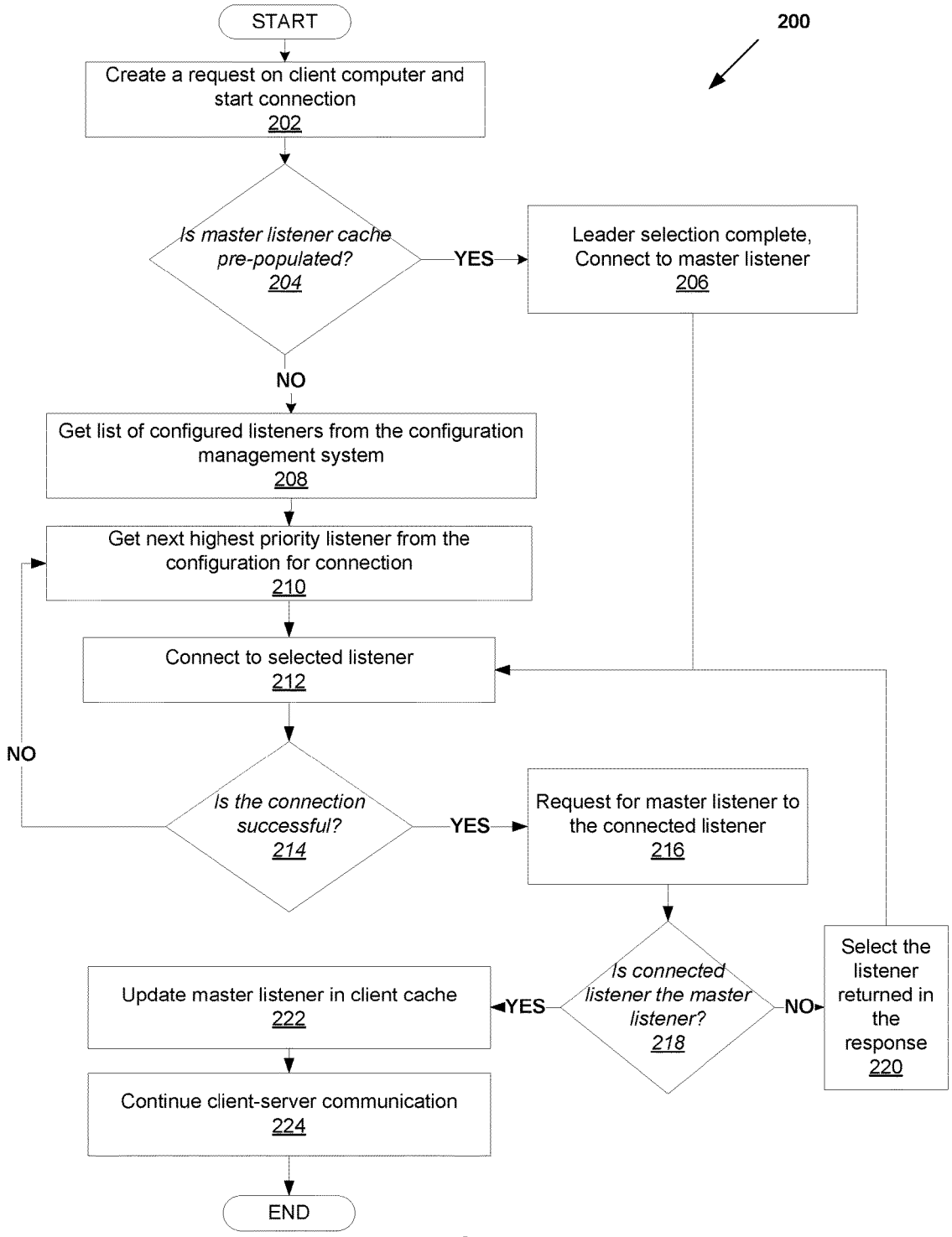
FIG. 2 depicts a flowchart illustrating the steps of an algorithm executed on a client computer for a client-initiated leader election, according to an embodiment of the present disclosure.

Referring now to FIG. 2, an operational flowchart 200 illustrating the steps carried out by the election initiation program 108 (FIG. 1) to request a leader election in a client-server distributed system such as the networked computer environment 100 (FIG. 1) is shown, according to an embodiment of the present disclosure.

At 202 the client computer 102 (FIG. 1) running the election initiation program 108 (FIG. 1) may create a request for a master listener (leader) election, after which a connection to at least one server computer 114 (also referred to as "listener") may be established. The client computer 102 (FIG. 1) may read the system configuration and, at 204, if the master listener cache is pre-populated, the leader selection may be completed at 206. In embodiments in which the master listener cache is pre-populated, the master listener information already exists in the listener cache and the master listener is present in the distributed system of FIG. 1. Then, the client computer 102 (FIG. 1) may connect to the selected listener at 212. At 214, if the connection to the selected listener is successful, then a request for a master listener is sent to the connected listener at 216. If the connected listener is the master listener (218), the master listener information may be updated in the cache of the client computer 102 (FIG. 1) and the client-server communication may continue at 224 with the connected listener as the master listener of the distributed system.

At 218, if the connected listener is not the master listener, then the connected listener returns the actual master listener details to the client computer 102 (FIG. 1) in response to its request. Now, the client computer 102 (FIG. 1) connects to the master listener whose details are provided in the response at 220 and the process returns to block 212. If the connection to the selected listener fails at 214, then the next highest priority listener may be obtained from the configuration for connection at 210.

If the master listener cache at 204 is not pre-populated, then a list of configured listeners from a configuration management system may be obtained at 208. The next highest priority listener from the configuration for connection may be obtained at 210. At 212, the client computer 102 (FIG. 1) connects to the selected listener and the process continues with block 214 described above.

Figure 3A:
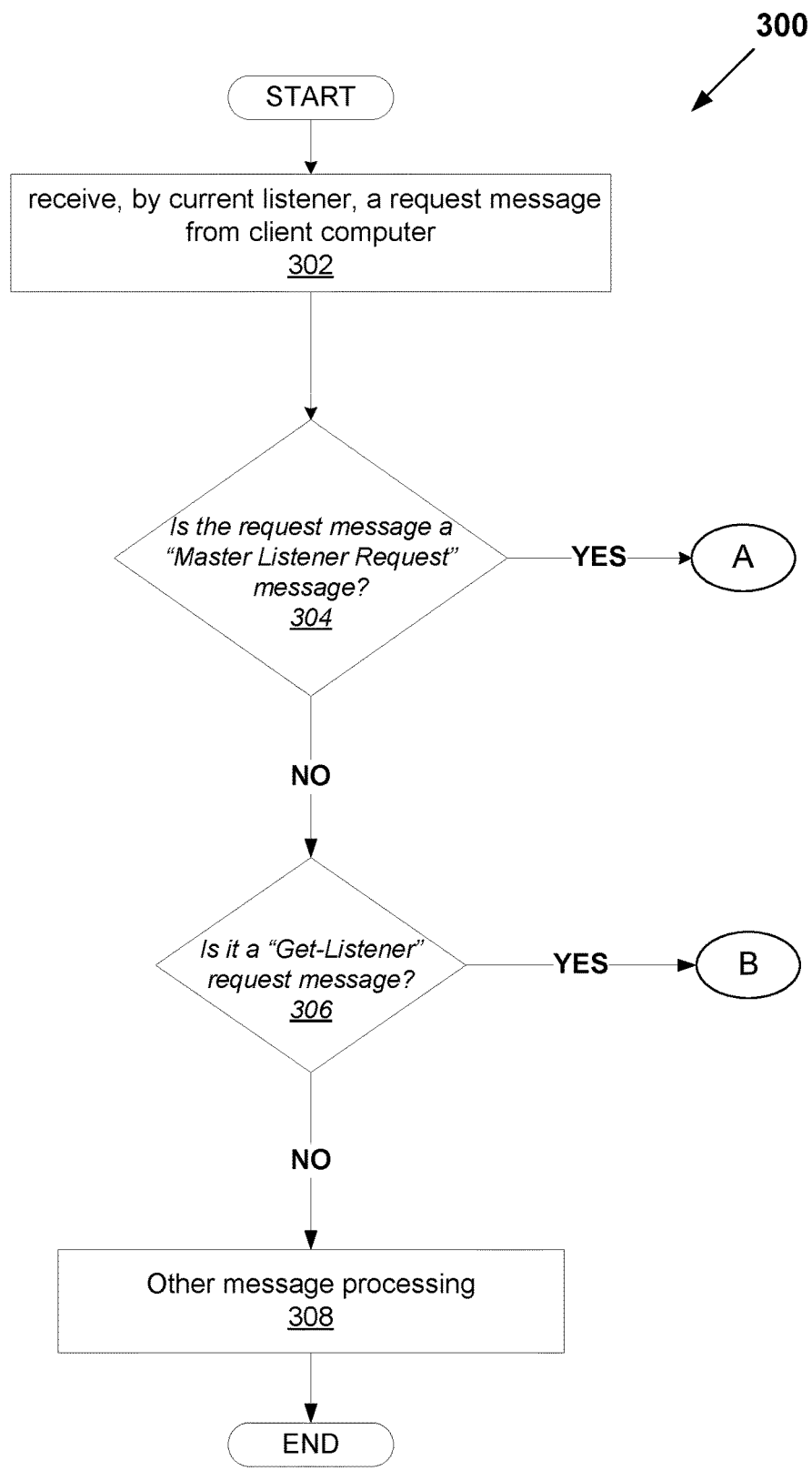
FIGS. 3A-3C depict a flowchart illustrating the steps of an algorithm executed on a server computer for the client-initiated leader election, according to an embodiment of the present disclosure.
Figure 3B:
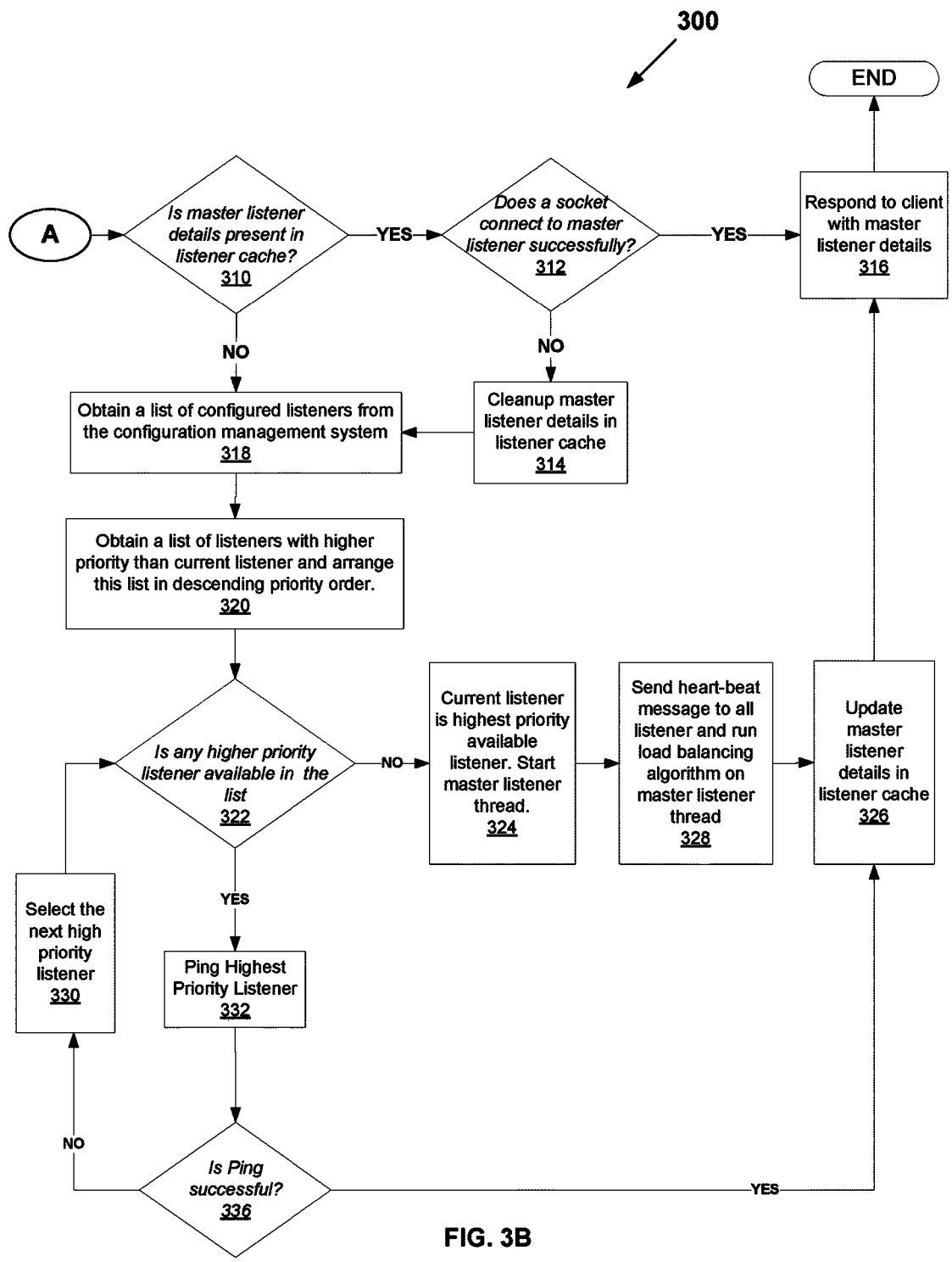
Figure 3C:
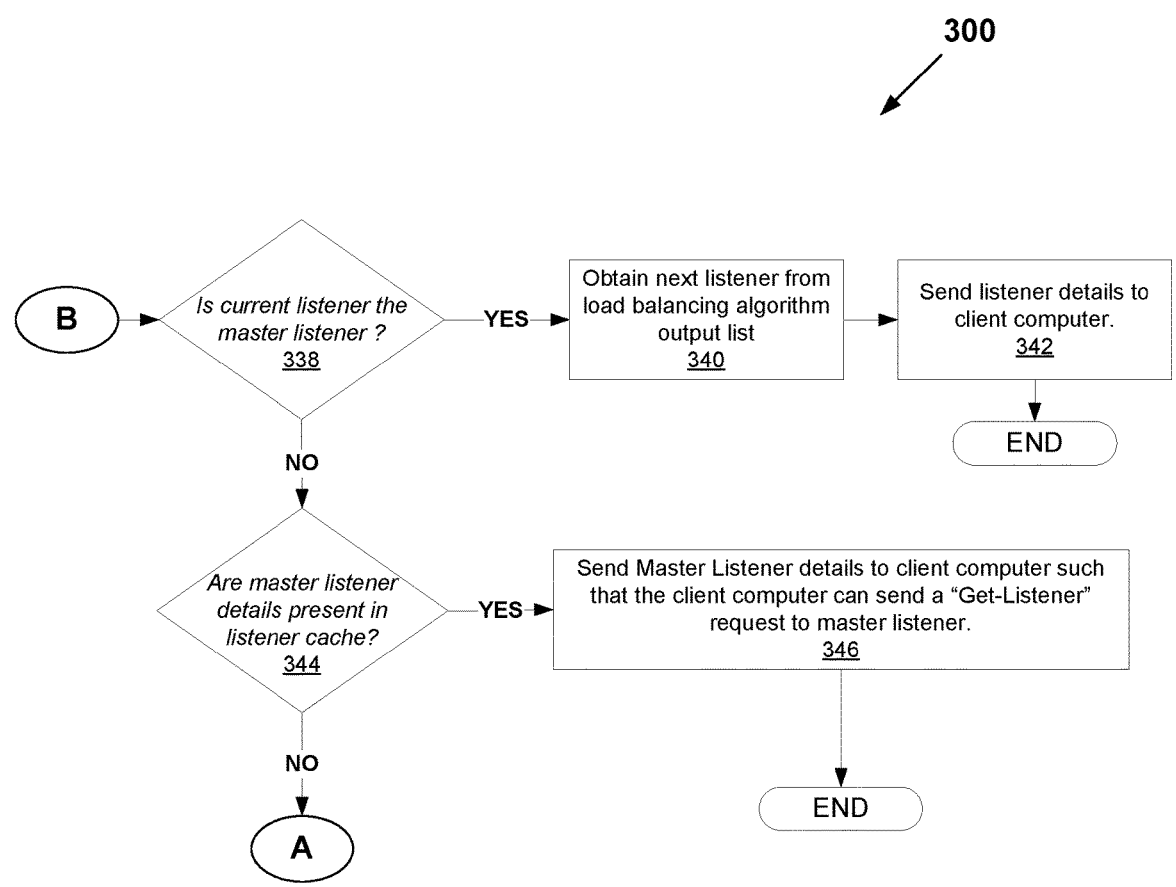

Referring now to FIGS. 3A-3C, an operational flowchart 300 illustrating the steps carried out by the master listener election program 112 (FIG. 1) to designate a leader in a client-server distributed system such as the networked computer environment 100 (FIG. 1) is shown, according to an embodiment of the present disclosure.

The leader election process may start, for example, in the server computer 114 (FIG. 1), by receiving a leader election request message from the client computer 102 (FIG. 1) at 302. The message request may be received by at least one server computer/listener 114 (FIG. 1) that is available in the distributed system (e.g. the networked computer environment 100 shown in FIG. 1). At 304, the available listener recognizes if the request message is a master listener request message or not. If the request message is a master listener request message, then the process may continue with block 310 in FIG. 3B.

At 310, if the master listener details are present in the listener cache and a socket connects to the master listener successfully (312), a response is sent at 316 to the client computer 102 (FIG. 1) including the master listener details. If the master listener details are present in the listener cache (310), but the master listener cannot successfully connect to the socket (312), the master listener details are cleaned in the listener cache at 314, and the master listener election process may start at 318, as will be described in detail below.

If the master listener details are not present in the listener cache (310), a list of configured listeners from the configuration management system may be obtained at 318. Next, at 320, a list of listeners having a higher priority than the current listener may be obtained and arranged in a descending priority order.

At 322, if the listener with the highest priority in the obtained list is available, then at 332 a test message via a ping utility program (hereinafter "ping") is sent to the available listener having the highest priority using a ping. As may be known by those skilled in the art, a ping is a standard networking utility program, currently available on most computers, by which connectivity to a determined remote server may be determined over a network. If the ping to the available listener having the highest priority is successful at 336, then the available listener having the highest priority becomes the master listener and master listener details are updated in the listener cache at 326. Finally, a response message is sent to the client computer 102 (FIG. 1) with the master listener details at 316. If the ping to the available listener having the highest priority fails at 336, then on the following iteration, the next highest priority listener from the list obtained at 320 is chosen at 330. Next, the process returns to 322 to find if the selected listener having the next highest priority is available.

Now, if the listener with the highest priority in the obtained list (320) is not available at 322, the current listener becomes the available listener with the highest priority and initiates a master listener thread at 324. The current listener sends a heart-beat message at 328 to all the listeners in the distributed system and runs a load-balancing algorithm on the master listener thread. Through the heart-beat message the current listener may indicate a normal operation and/or synchronize all the listeners in the distributed system. As previously described, the main purpose of the master listener is to process the request from the client computer 102 (FIG. 1) and send it to the appropriate allocated listener using a load-balancing algorithm.

The load-balancing algorithm is run on the master listener and whenever there is a request from a client computer for a listener (server computer), based on the load balancing algorithm, the master listener returns the next available listener to the client computer. It should be noted that load-balancing algorithms are typical and well-known to those skilled in the art.

Subsequently, at 326, master listener details are updated in the current listener cache and a response is sent at 316 to the client computer 102 (FIG. 1) with the master listener details.

Returning to block 304 in FIG. 3A, if the request message sent by the client computer 102 (FIG. 1) is not a master listener request message, the process may continue with block 306. At 306, if the request message is a get-listener request message, the process may continue with block 338 in FIG. 3C. At 338, if the current listener is the master listener, then details about the current listener are obtained from an output list of the load balancing algorithm at 340. It should be noted that the master listener will provide the next available listener which will serve the client computer requests from the output list of the load balancing algorithm. Subsequently, at 342, the listener details obtained at 340 are sent to the client computer 102 (FIG. 1).

If, at 338, the current listener is not the master listener but master listener details exist in the listener cache (344), then the master listener details are sent from the current listener to the client computer 102 (FIG. 1), such that the client computer 102 (FIG. 1) can send a get-listener request to the master listener at 346.

If, at 338, the current listener is not the master listener and the master listener details don't exist in the listener cache, the process may go back to block 310 in FIG. 3B described above.

It should be noted that if the elected master listener goes down (fail over), the next election request from the client computer 102 (FIG. 1) will go to the next highest priority listener and the election may take place on that node. By doing so the fail over may be seamless and transparent to a user.

It should also be noted that collisions may occur only in the case of network partition. In such instances each partition may have its own master listener serving requests from client computers coming to the partition.

Embodiments of the present disclosure propose a mechanism to elect a leader (master listener) among existing servers in a distributed system with the least amount of messages exchanged between nodes and a low probability of collision. In the proposed system, listener nodes (servers) may be running on multiple computers waiting for a request from a client computer. It should be noted that the election of a leader will not take place until there is a request from the client computer (e.g. client computer 102 in FIG. 1).

Once this listener cluster receives a request from the client computer to serve a request on any of the listener nodes (client selects the node based on priorities defined in system configuration as described above), that listener will check if the master listener is already there, if it is present then it returns the details of the elected master listener to the client computer for further processing. If the master listener is not already elected or not available then it starts the election of the leader from available listener nodes based on their priorities.

The priority of each listener to become the master listener may be pre-configured and changed during the course of time. Each listener (server) reads the configuration upon listener startup or when there is any change in priority. The listener that receives the client request will start the master listener election algorithm by first checking if it is the highest priority listener, if it is the highest priority listener, then it becomes the master listener and updates other listener via a heartbeat request as described above. Other listeners may update their configuration with the master listener information and use it for further request serving.

The election of the master listener takes place using a minimal number of exchanged between nodes (best case 1 message exchanged and worst case 'n' messages exchanged). By allowing a communication only with the master listener and not between nodes network chatter may be decreased. Whenever a request goes to a listener with lower priority, that listener checks for the available listener and their priorities and once it finds that there is a higher priority listener available it informs the client computer about that listener in response to its request. The client computer may connect to that listener making it the master listener.

Figure 4:
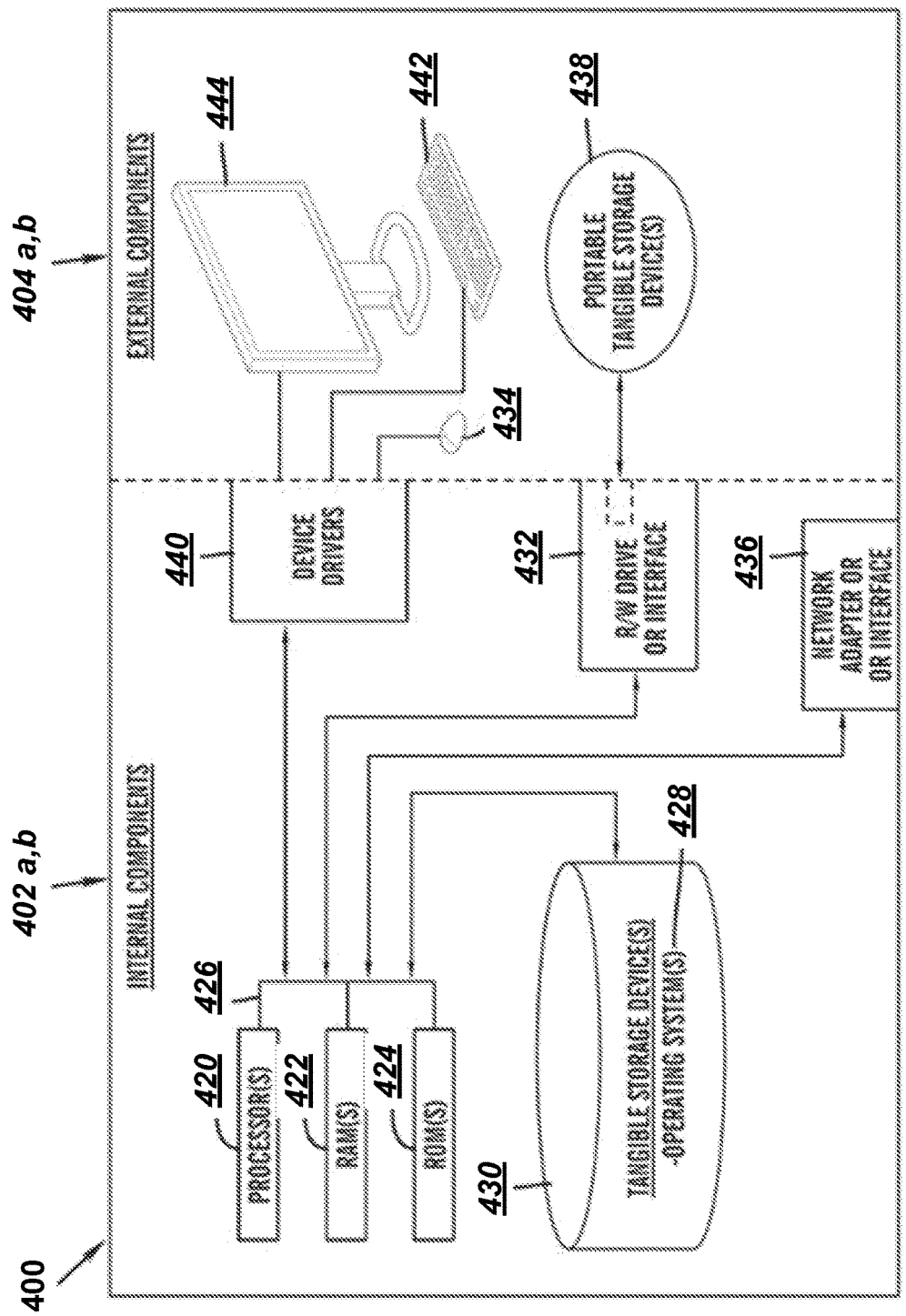
FIG. 4 depicts a block diagram of internal and external components of computers and servers described in FIG. 1, according to an embodiment of the present disclosure.

Referring now to FIG. 4, a block diagram 400 of internal and external components of computers depicted in FIG. 1 is shown according to an embodiment of the present disclosure. It should be appreciated that FIG. 4 provides only an illustration of one implementation and does not imply any limitations with regard to the environments in which different embodiments may be implemented. Many modifications to the depicted environments may be made based on design and implementation requirements.

Data processing system 402, 404 is representative of any electronic device capable of executing machine-readable program instructions. Data processing system 402, 404 may be representative of a smart phone, a computer system, PDA, or other electronic devices. Examples of computing systems, environments, and/or configurations that may be represented by data processing system 402, 404 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

The server computer 114 (also referred to as network server) shown in FIG. 1 may include sets of internal components 402a and external components 404a illustrated in FIG. 4. The internal components 402a include one or more processors 420, one or more computer-readable RAMs 422 and one or more computer-readable ROMs 424 on one or more buses 426, and one or more operating systems 428 and one or more computer-readable tangible storage devices 430. The one or more operating systems 428, the election initiation program 108 (FIG. 1) and the master listener election program 112 (FIG. 1) in server computer 114 (FIG. 1) are stored on one or more of the respective computer-readable tangible storage devices 430 for execution by one or more of the respective processors 420 via one or more of the respective RAMs 422 (which typically include cache memory). In the embodiment illustrated in FIG. 4, each of the computer-readable tangible storage devices 430 is a magnetic disk storage device of an internal hard drive. Alternatively, each of the computer-readable tangible storage devices 430 is a semiconductor storage device such as ROM 424, EPROM, flash memory or any other computer-readable tangible storage device that can store a computer program and digital information.

The internal components 402a also includes a R/W drive or interface 432 to read from and write to one or more portable computer-readable tangible storage devices 438 such as a CD-ROM, DVD, memory stick, magnetic tape, magnetic disk, optical disk or semiconductor storage device. A software program, such as the election initiation program 108 (FIG. 1), and the master listener election program 112 (FIG. 1) can be stored on one or more of the respective portable computer-readable tangible storage devices 438, read via the respective R/W drive or interface 432 and loaded into the respective hard drive 430.

The internal components 402a also includes network adapters or interfaces 436 such as a TCP/IP adapter cards, wireless Wi-Fi interface cards, or 3G or 4G wireless interface cards or other wired or wireless communication links. The election initiation program 108 (FIG. 1) and the master listener election program 112 (FIG. 1) can be downloaded to client computer 102 (FIG. 1) and server computer 114 (FIG. 1), respectively, from an external computer via a network (for example, the Internet, a local area network or other, wide area network) and respective network adapters or interfaces 436. From the network adapters or interfaces 436, the election initiation program 108 (FIG. 1) in client computer 102 (FIG. 1) and the master listener election program 112 (FIG. 1) in server computer 114 (FIG. 1) are loaded into the respective hard drive 430. The network may comprise copper wires, optical fibers, wireless transmission, routers, firewalls, switches, gateway computers and/or edge servers.

The external components 404a can include a computer display monitor 444, a keyboard 442, and a computer mouse 434. External components 404a can also include touch screens, virtual keyboards, touch pads, pointing devices, and other human interface devices. The internal components 402 also includes device drivers 440 to interface to computer display monitor 444, keyboard 442 and computer mouse 434. The device drivers 440, R/W drive or interface 432 and network adapter or interface 436 comprise hardware and software (stored in storage device 430 and/or ROM 424).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 5:
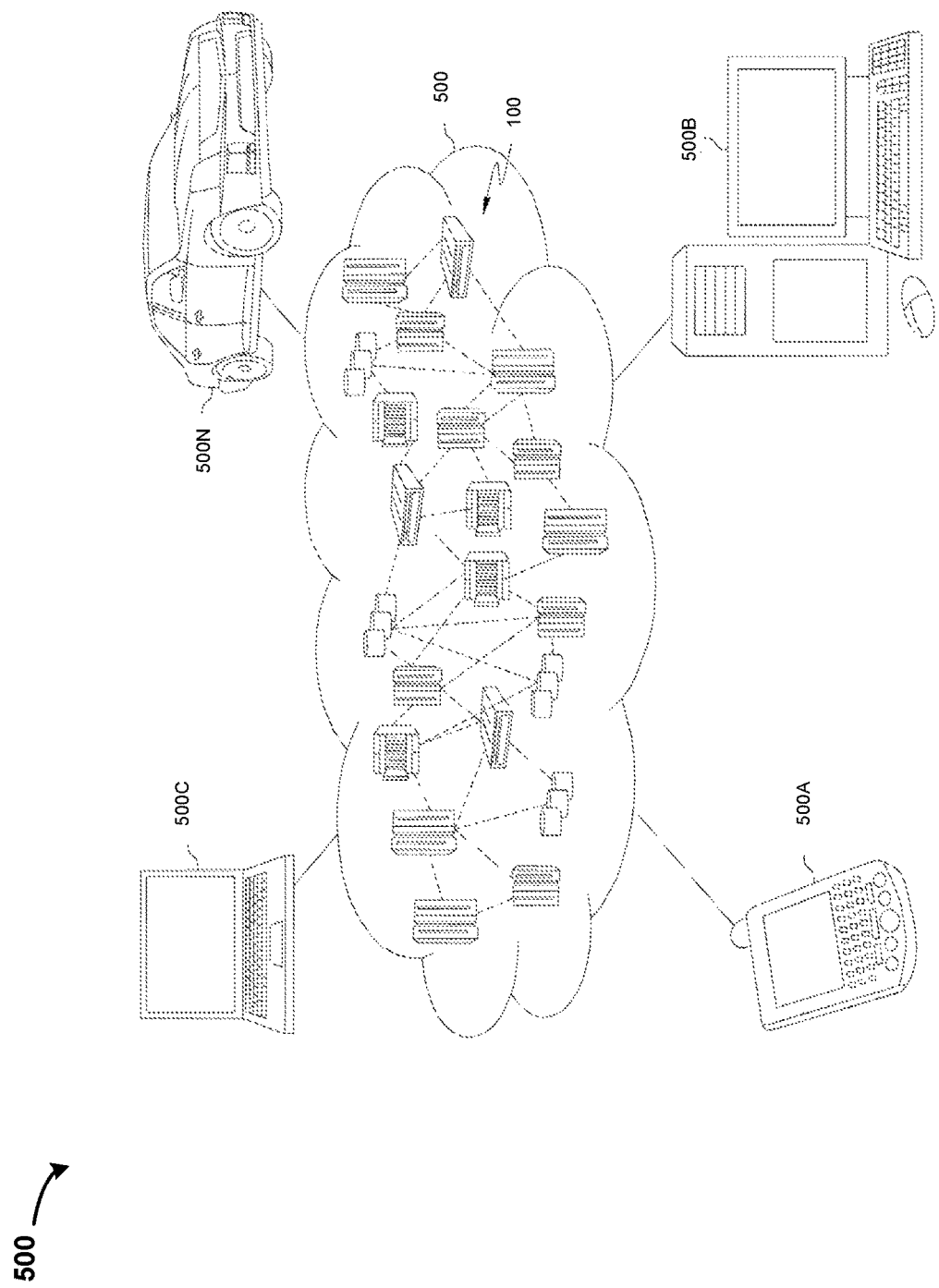
FIG. 5 depicts a block diagram of an illustrative cloud computing environment including the computer system depicted in FIG. 1, according to an embodiment of the present disclosure.

Referring now to FIG. 5, illustrative cloud computing environment 500 is depicted. As shown, cloud computing environment 500 comprises one or more cloud computing nodes 100 with which local computing devices used by cloud consumers, such as, for example, personal digital assistant (PDA) or cellular telephone 500A, desktop computer 500B, laptop computer 500C, and/or automobile computer system 500N may communicate. Cloud computing nodes 100 may communicate with one another. They may be grouped (not shown) physically or virtually, in one or more networks, such as Private, Community, Public, or Hybrid clouds as described hereinabove, or a combination thereof. This allows cloud computing environment 500 to offer infrastructure, platforms and/or software as services for which a cloud consumer does not need to maintain resources on a local computing device. It is understood that the types of computing devices 500A-N shown in FIG. 5 are intended to be illustrative only and that cloud computing nodes 100 and cloud computing environment 500 can communicate with any type of computerized device over any type of network and/or network addressable connection (e.g., using a web browser).

Figure 6:
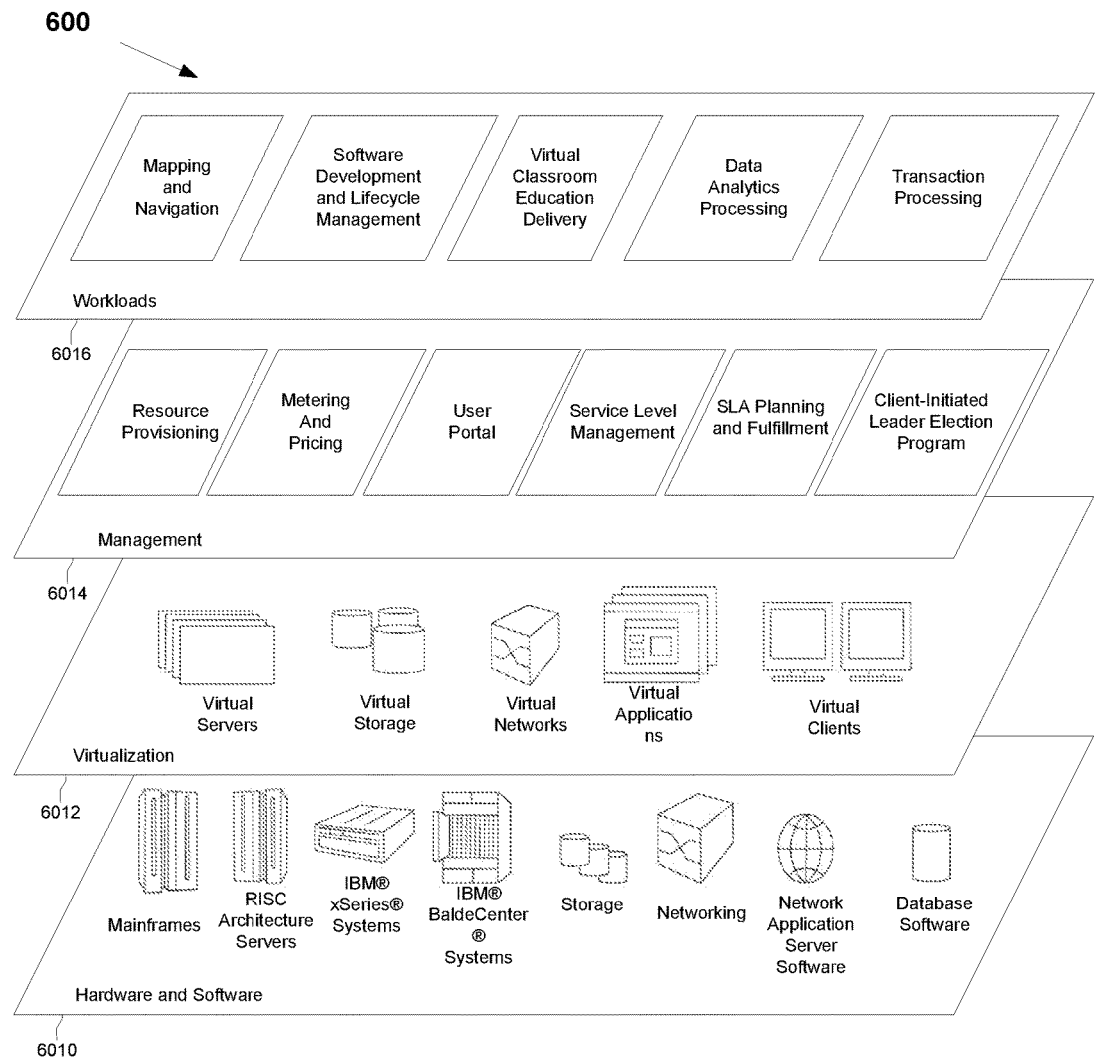
FIG. 6 depicts a block diagram of functional layers of the illustrative cloud computing environment of FIG. 5, according to an embodiment of the present disclosure.

Referring now to FIG. 6, a set of functional abstraction layers 600 provided by cloud computing environment 500 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 6010 includes hardware and software components. Examples of hardware components include: mainframes; RISC (Reduced Instruction Set Computer) architecture based servers; storage devices; networks and networking components. In some embodiments, software components include network application server software.

Virtualization layer 6012 provides an abstraction layer from which the following examples of virtual entities may be provided: virtual servers; virtual storage; virtual networks, including virtual private networks; virtual applications and operating systems; and virtual clients.

In one example, management layer 6014 may provide the functions described below. Resource provisioning provides dynamic procurement of computing resources and other resources that are utilized to perform tasks within the cloud computing environment 500. Metering and Pricing provide cost tracking as resources are utilized within the cloud computing environment 500, and billing or invoicing for consumption of these resources. In one example, these resources may comprise application software licenses. Security provides identity verification for cloud consumers and tasks, as well as protection for data and other resources. User portal provides access to the cloud computing environment 500 for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA. A client-initiated master listener election program 112 (FIG. 1) may select a leader node on a distributed system.

Workloads layer 6016 provides examples of functionality for which the cloud computing environment 500 may be utilized. Examples of workloads and functions which may be provided from this layer include: mapping and navigation; software development and lifecycle management; virtual classroom education delivery; data analytics processing; and transaction processing.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A computer program product for a client-initiated leader election in a distributed client server computing system comprising a plurality of server computers and a client computer, the computer program product comprising a computer readable storage medium having program instructions embodied therewith, the program instructions executable by a computer to cause the computer to perform a method comprising:

establishing a connection between a first server computer of the plurality of server computers and the client computer;

receiving, by the first server computer, a master server election request from the client computer;

determining if one of the plurality of server computers is designated as a master server in a master server cache by reading a system configuration of the distributed client server computing system in response to receiving the master server election request from the client computer, wherein the master server cache stores information designating one of the plurality of server computers as the master server;

obtaining a list of the plurality of server computers from a configuration management system in response to no one server computer of the plurality of server computers being designated as the master server in the master server cache;

arranging the list of the plurality of server computers in a descending order based on a predetermined priority of each server computer to become the master server;

verifying connectivity to a second server computer of the plurality of server computers by sending a test message to the second server computer using a ping utility program, wherein the second server computer is one of the plurality of server computers on the list having the highest priority;

designating the second server computer as the master server in response to verifying connectivity to the second server computer by updating the master server cache;

updating system configuration and notifying all of the plurality of server computers of the distributed client server computing system of the designation of the second server computer as the master server by sending a heartbeat message to each of the plurality of server computers;

sending a response message to the client computer comprising information about the designation of the second server computer as the master server; and establishing a connection between the master server and the client computer, wherein the master server receives future requests from the client computer, forwards future requests received form the client computer onto an appropriate server computer of the plurality of server computers, and manages load balancing among all of the plurality of server computers.

* * * * *